United States Patent [19]

Kemeny

[11] Patent Number: 5,052,008
[45] Date of Patent: Sep. 24, 1991

[54] CURRENT INJECTION LASER

[75] Inventor: Peter C. Kemeny, Camberwell, Australia

[73] Assignee: Australian Telecommunications Corporation, Victoria, Australia

[21] Appl. No.: 403,534

[22] Filed: Sep. 6, 1989

[51] Int. Cl.$^5$ .............................................. H01S 3/19
[52] U.S. Cl. ...................................... 372/45; 372/46; 372/92; 372/96
[58] Field of Search ....................... 372/44, 45, 46, 92, 372/96

[56] References Cited

U.S. PATENT DOCUMENTS 4,309,670 1/1982 Burnham et al. ..................... 372/46

Primary Examiner—James W. Davie
Attorney, Agent, or Firm—Fish & Richardson

[57] ABSTRACT

A current injection laser including a single crystal substrate of a given refractive index upon which is positioned successively, an inner reflection formed by a first set of epitaxial single crystal layers, a resonator layer and an outside reflector layer formed by a second set of epitaxial single crystal layers. At least one of the inner reflector, resonator and outer reflector being of p-type or n-type conductivity and at least one of the inner reflector, resonator and outer reflector being of opposite type conductivity.

49 Claims, 1 Drawing Sheet

CURRENT INJECTION LASER

The invention relates to the field of lasers.

BACKGROUND OF THE INVENTION

Current injection lasers having Fabry-Perot, distributed feedback, or distributed Bragg reflection type resonators are known. Generally, however, they are inconvenient to form requiring formation of mirror facets by cleaving or etching.

SUMMARY OF THE INVENTION

An object of the invention is to provide a current injection laser which may be placed anywhere on a single crystal substrate, and which may be readily formed.

In one aspect, the invention provides a current injection laser comprising structure defining a single crystal substrate, having some refractive index, on which are positioned, in succession, an inner reflector formed by a first set of epitaxial single crystal layers, a resonator layer, an outside reflector formed by a second set of epitaxial single crystal layers, at least one part of said structure, being of one or more of the inside reflector, substrate and resonator layer, being electrically conductive and of either p-type or n-type conductivity, at least another part of said structure, being one or more of the outside reflector and resonator layer, being made electrically conductive and being of either n-type or p-type conductivity, but of different conductivity type to said one part, said structure further including first and second electrically conductive means making ohmic contact respectively to said one part and said another part of said structure whereby to enable, by application of electrical potential to said electrically conductive means, an electrical current to flow through said structure to cause it to generate coherent light by laser action, said layers comprising the reflectors being such that a compositional periodicity having optical thickness of $\lambda/2$ or an odd multiple thereof is achieved, where $\lambda$ is the wavelength of light so generated, the thickness d of the resonator layer being defined by the following relationship:

$$\frac{2\pi N_r(I_t)d}{\lambda_m} - \frac{\phi_1 + \phi_2}{2} = m\pi$$

$$m = 0, 1, 2 \ldots$$

where $\lambda_m$ is a possible operating wavelength, $N_r(I_t)$ is the refractive index of the resonator layer at current $I_t$, being the current through the laser at the threshold of lasing, and $\phi_1$ and $\phi_2$ are defined by the following relationships:

$$r_i = r_1 \exp(j\phi_1)$$

where $r_1$ is the magnitude of reflectance of layers comprised in the inner reflector, and $\phi_1$ is the phase shift on such reflectance.

$$r_o = r_2 \exp(j\phi_2)$$

where $r_2$ is the magnitude of reflectance of layers in the outer reflector, and $\phi_2$ is the phase shift on such reflectance, the laser being characterized in that m has a value in the range 0 to 10, m can be varied over said range to optimize the laser characteristics, namely, threshold currently density and response time, for the particular application. The most appropriate value of m for a given application will depend on the details of the embodiment of the laser device including the materials employed, physical dimensions, cladding, passivation, design of external driving circuitry and operating temperature.

It has been found that, by selection of m in the range indicated, efficient operation can be obtained.

In one embodiment, the aforementioned compositional periodicity is achieved by appropriate selection of the layers in the reflector as having suitable thickness, substantially $\frac{1}{4}\lambda$, and as having alternating high and low refractive indices. In an alternative embodiment the composition and hence the refractive index of the reflector can be varied in a continuous or piece-wise manner.

Generally speaking, maximum optical gain will be obtained at an operating wavelength $\lambda_g$ which is near the value of wavelength at which the peak in luminescent intensity from the material of which the resonator layer is formed (as prevailing below the threshold of lasing) occurs, such that:

$$\lambda_m \approx \lambda_g$$

The refractive index $N_b$ of the layer of the inside reflector adjacent to the resonator layer, and $N_a$, the refractive index of the layer of the outside reflector immediately adjacent the resonator layer should be related to $N_r(I_t)$, the refractive index of the resonator layer at the current through the laser occuring at the threshold of lasing, by:

$$N_b < N_r(I_t) \text{ if } N_a < N_r(I_t)$$

or $$N_b > N_r(I_t) \text{ if } N_a > N_r(I_t)$$

Furthermore, in the case where, as is usual, $$\phi_1 + \phi_2 = 2\pi$$

or $$\phi_1 + \phi_2 = o$$

the above equation relating $\lambda_m$, m, $N_r(I_t)$ and d may be reduced to:

$$N_r(I_t)d = \frac{m'\lambda_{m'}}{2}$$

$$\text{where } m' = \begin{cases} m + 1 & , \phi_1 + \phi_2 = 2\pi \\ m & , \phi_1 + \phi_2 = o \end{cases}$$

Thus, in accordance with this invention, in this instance, m' runs over values 1, ... 10.

BRIEF DESCRIPTION OF THE DRAWINGS

The invention is further described by way of example only with reference to the accompanying drawings, the single FIGURE of which is a diagrammatic perspective view of a laser constructed in accordance with this invention.

PREFERRED EMBODIMENT

Figure 1:
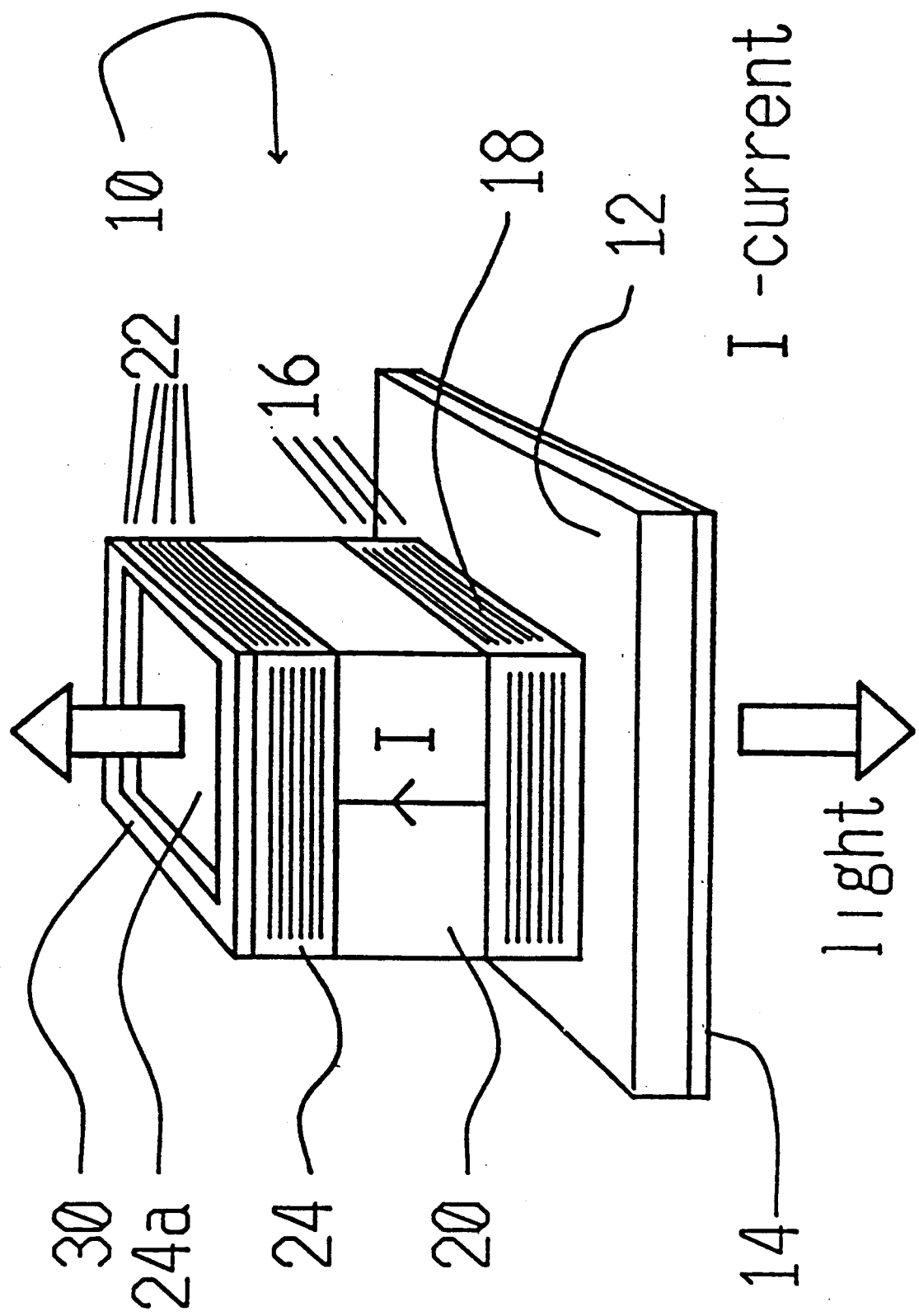

The laser 10 shown in the drawing comprises a substrate 12 in the form of a single crystal having a refractive index $N_s$. The substrate may be provided on its "rear" face with one or more layers of material intended to reduce the reflectivity of the rear surface from its uncoated value, at the wavelength of operation of the laser, and may have regions of metalisation intended to make ohmic contact to the device. In this instance, a layer 14 of metalisation is shown.

Upon the substrate is a first set of epitaxial single crystal layers 16 which together constitute an inside reflector 18. The composition, thickness, and a number of these layers constitute variables which are selected to give desirable properties of reflectivity, electrical conduction, transparency, stability and crystal growth parameters, in accordance with known factors for current injection lasers and thin film optics.

The inside reflector is characterized in part, by its complex reflectance amplitude $r_i$ where:

$$r_i = r_1 \exp(j\phi_1),$$

where $r_1$ is the magnitude of reflectance.

Positioned immediately above and in contact with inside reflector 18 is a resonator layer with thickness "d" and refractive index $N_r(I)$ for light travelling at normal incidance through this layer, where I is the current flowing through the laser. This refractive index should have the property that either:

$$N_b < N_r(I_t) \text{ if } N_a < N_r(I_t)$$

or $$N_b > N_r(I_t) \text{ if } N_a > N_r(I_t),$$

where $N_b$ is the refractive index of the layer of the inside reflector 18 which is adjacent to the resonator layer, $N_a$ is the refractive index of that one of a number of layers 22 next described which is immediately adjacent and in contact with resonator layer 20, but at the opposite side thereof to inside reflector 18, and $I_t$ is the current through the laser at threshold (i.e. onset of lasing action).

The substrate and subsequent material layers are single crystals composed of any compounds or alloys of the elements of the periodic table, or pure elements, suitable for the purpose. For example, the substrate and subsequent layers may be composed of Gallium, Aluminium and Arsenic combined in particular proportions in particular layers.

Alternatively, the substrate and subsequent layers may be composed of Gallium, Indium, Arsenic, and Phosphorous combined in particular proportions in particular layers.

Alternatively, the substrate and subsequent layers may be composed of Gallium, Indium, Aluminium, Arsenic, and Antimony combined in particular proportions in particular layers.

Alternatively, the substrate and subsequent layers may be composed of Mercury, Cadmium, Manganese and Tellurium combined in particular proportions in particular layers.

Alternatively, the substrate and subsequent layers may be composed of Lead, Sulphur Tellurium and Selenium combined in particular proportions in particular layers.

Other material systems are possible and will be apparent to those skilled in the art.

In addition each of the said layers may in turn be composed of still finer layers, known as superlattice or as multi-quantum-well structures, or the said layers may be continuously graded in composition.

At current below the threshold value for lasing, the refractive index $N_r(I)$ may vary as some function of the Current flowing through the resonator layer 20, but above threshold, $N_r(I)$ remains constant within a very good degree of approximation, since stimulated emission dominates the recombination, pinning the injected carrier density. The thickness of the resonator layer is discussed later.

Above the resonator layer there is provided the aforementioned set of layers 22 each in the form of an epitaxial single crystal. These layers together constitute an outside reflector 24. As with the inside reflector 18, the layers 22 constituting the outside reflector are selected to give desirable properties of reflectivity, electrical conduction, transparency, stability and crystal growth parameters, in accordance with known factors for current injection lasers.

The outside reflector 24 may be characterized in part by its complex reflectance amplitude $r_o$ where:

$$r_o = r_2 \exp(j\phi_2).$$

Where $r_2$ is the reflectance amplitude.

At the side of the outside reflector 24 remote from resonater layer 20, the reflector 24 is in contact with incident medium having refractive index $N_i$.

$I_t$ is necessary that some part of the inside reflector and/or the substrate and/or the resonator layer be made electrically conducting by the incorporation of impurity atoms. This conduction, referred to hereinafter as conduction of the first type, may be by electrons (n-type) or holes (p-type).

A first metalisation (14) appropriate to make ohmic contact to the doped material of the first conduction type is applied on the substrate 12 or elsewhere on or near the laser so as to make ohmic contact to this doped material only.

Some part of the outside reflector 24 and/or the resonator layer 20 is made electrically conducting by the incorporation of impurity atoms. This conduction, hereinafter called conduction of the second type, may be by electrons (n-type) or holes (p-type). If the first conduction type is n-type, then the second conduction type is p-type and if the first conduction type is p-type, the second conduction type is n-type.

A second metalisation appropriate to make ohmic contact to the doped material of the second conduction type is applied on or near the laser so as to make ohmic contact to this doped material only. Such metalisation is shown as a metalised loop 30 formed on the surface 24a of outside reflector 24 remote from resonator layer 20.

It is convenient to refer to the entirety of the substrate 12, the inner and outer reflectors 18, 24, the resonator layer 20, together with the described metalisation and the other coatings to either side of the layer 20 or reflectors 18, 24, as a "material structure". One or more lasers or groups of lasers may be formed on the material structure by etching or by other means of isolation so that when a forward bias voltage is applied between the metalisation ,making contact to those parts of the material structure which are respectively of first and second conduction types, and associated with a particular laser or group of lasers, current flow occurs predominantly along a direct path between the n-type and p-type materials of each particular laser so connected. The forward bias is, as is conventional, obtained by raising the electrical potential of the p-type material above that of the n-type material.

The laser structure described here and illustrated in the figure may be partially or fully surrounded by materials including semiconductors (either irradiated by energetic particles such as protons or otherwise), polymers, or dielectrics to provide passivation, reduce or enhance surface recombination, provide optical confinement, or to enhance environmental stability.

In plan view (from above) the laser may be any shape including square rectangular, circular or ellipsoidal. The side walls, if any, may be perpendicular to the substrate, or sloping or curved.

Possible laser operating wavelengths $\lambda_m$ are given approximately by the expression:

$$\frac{2\pi N_r(I_t)d}{\lambda_m} - \frac{\phi_1 + \phi_2}{2} = m\pi$$

$$m = 0, 1, 2 \ldots$$

where the refractive index in the resonator layer is $N_r(I_t)$ for all values of current above threshold. Maximum optical gain is obtained from the resonator layer at a wavelength $\lambda_g$ near the value of wavelength $\lambda_p$, where the peak in luminescent intensity for the resonator layer material, below threshold, is observed to occur. It is desirable to choose values of d and m such that:

$$\lambda_m \approx \lambda_g$$

since this tends to minimize the threshold current. For small values of m, the laser will operate stably in a single longitudinal mode, since all other modes will be far from the region of significant gain. Minimum threshold current will generally be achieved for a particular material system, when a variable, m' (defined below) is close to 1.

It will be appreciated that the above equation relating $N_r(I_t)$, d, $\lambda_m$, $\phi_1$ $\phi_2$ may for many purposes be reduced to the following form:

$$N_r(I_t)d = \frac{m' \lambda_{m'}}{2}$$

$$\text{where } m' = \begin{cases} m + 1 & , \phi_1 + \phi_2 = 2\pi \\ m & , \phi_1 + \phi_2 = o \end{cases}$$

this arises because, generally speaking, $$\phi_1 + \phi_2 = 2\pi$$

$$\phi_1 + \phi_2 = o$$

It has been found that by choosing a value of m' in the range 1 to approximately 10, it is possible to achieve very efficient operation for lasers constructed in accordance with the invention.

Lasers formed in accordance with the invention have the significant advantage that they can be formed without requiring formation of mirror facets by cleaving, or etching.

In one embodiment the laser may for example be a cylinder having a diameter of approximately 10 micrometers. This will yield a non-astigmatic output beam having small divergence compared to conventional semiconductor waveguide lasers. The power density at the output facet will be small compared to semiconductor waveguide lasers, thus allowing higher power operation without facet damage. Lasers having a small value of m will oscillate in a single longitudinal mode. These properties, which will also be present in many other embodiments of the device, are advantageous for applications including fibre-optical communications, optical data storage and retrieval, optical computing, and optical pumping of other lasers.

Lasers arranged in side by side position, such as in linear or two-dimensional arrays may be readily constructed.

The described laser has been advanced merely by way of explanation, and many modifications and variations may be made within the scope of the appended claims.

What is claimed is:

1. A current injection laser comprising structure defining a single crystal substrate, having a refractive index, and, positioned on said substrate, in succession, an inner reflector formed by a first set of epitaxial single crystal layers, a resonator layer, and an outside reflector formed by a second set of epitaxial single crystal layers, at least a first set of elements of at least one of said inner reflector, said substrate and said resonator layer being electrically conductive, and at least a second set of elements of at least one of said outside reflector and said resonator layer being electrically conductive, one said set of elements being of p-type conductivity and the other said set of elements being of n-type conductivity, said structure further including first and second electrically conductive means making ohmic contact respectively to said first set of elements and said second set of elements whereby to enable, by application of electrical potential to said electrically conductive means, an electrical current to flow through said structure to cause it to generate coherent light by laser action, said layers comprising the reflectors being such that a compositional periodicity having optical thickness of $\lambda/2$ ) or an odd multiple thereof is achieved, where $\lambda$ is the wavelength of light so generated, the thickness of the resonator layer being defined by the following relationships:

$$\frac{2\pi N_r(I_t)d}{\lambda_m} - \frac{\phi_1 + \phi_2}{2} = m\pi$$

$$m = 0, 1, 2 \ldots$$

where $\lambda_m$ is a possible operating wavelength, $N_r(I_t)$ is the refractive index of the resonator layer at current $I_t$, being the current through the laser at the threshold of lasing, and $\phi_1$ and $\phi_2$ are defined by the following relationships:

$$r_i = r_1 \exp(j\phi_1)$$

where $r_1$ is the magnitude of reflectance of layers comprised in the inner reflector, and $\phi_1$ is the phase shift on such reflectance, $$r_0 = r_2 \exp(\phi_2)$$

where $r_2$ is the magnitude of reflectance of layers in the outer reflector, and $\phi_2$ is the phase shift on such reflectance, the laser being characterized in that m has a value in the range 0 to 10.

2. A current injection laser as claimed in claim 1 wherein said compositional periodicity is achieved by the selection of the layers in the reflector as having a determined thickness, substantially ¼λ, and as having alternating high and low refractive indices.

3. A current injection laser as claimed in claim 1 wherein to achieve said compositional periodicity, the composition, and thus refractive index of the reflector is varied in a continuous or piece-wise manner.

4. A current injection laser as claimed in claim 1 wherein the refractive index $N_b$ of the layer of the inside reflector adjacent to the resonator layer, and $N_a$, the refractive index of the layer of the outside reflector immediately adjacent the resonator layer are related to $N_r(I_t)$, the refractive index of the resonator layer at the current through the laser occuring at the threshold of lasing, by:

$$N_b < N_r(I_t) \text{ if } N_a < N_r(I_t).$$

5. A current injection laser as claimed in claim 1 wherein the refractive index $N_b$ of the layer of the inside reflector adjacent to the resonator layer, and $N_a$, the refractive index of the layer of the outside reflector immediately adjacent the resonator layer are related to $N_r(I_t)$, the refractive index of the resonator layer at the current through the laser occuring at the threshold of lasing, by:

$$N_b > N_r(I_t) \text{ if } N_a > N_r(I_t).$$

6. A current injection laser as claimed in claim 1 wherein the composition and hence the refractive index of the reflector is varied in a continuous or piece-wise manner such that a compositional periodicity having optical thickness of λ/2 or some odd multiple thereof is achieved.

7. A current injectin laser as claimed in any one of claims 1 or 2 wherein said substrate and subsequent material layers are single crystals of materials selected from the group comprising Gallium, Aluminium and Arsenic combined in particular proportins in particular layers.

8. A current injection laser as claimed in any one of claims 1 to 3 wherein said substrate and subsequent material layers are single crystals of materials selected from the group comprising Gallium, Indium, Arsenic and Phosphorous combined in particular proportions in particular layers.

9. A current injection laser as claimed in any one of claims 1 to 3 wherein said substrate and subsequent material layers are single crystals of materials selected from the group comprising Gallium, Indium, Aluminium, Arsenic, and Antimony combined in particular proportions in particular layers.

10. A current injection laser as claimed in any one of claims 1 to 3 wherein said substrate and subsequent material layers are single crystals of materials selected from the group comprising Mercury, Cadmium, Manganese and Tellurium combined in particular proportions in particular layers.

11. A current injection laser as claimed in any one of claims 1 to 3 wherein said substrate and subsequent material layers are single crystals of materials selected from the group comprising Lead, Sulphur Tellurium and Selenium combined in particular proportions in particular layers.

12. A current injection laser as claimed in any one of claims 1 to 3 wherein the wavelength of operation of the laser, λg, is near the value of λg, being a wavelength where occurs the peak in luminescent intensity for the resonator layer material, below the threshold.

13. A current injection laser as claimed in any one of claims 4 to 6 wherein said substrate and subsequent material layers are single crystals of materials selected from the group comprising Gallium, Aluminium and Arsenic combined in particular proportions in particular layers.

14. A current injection laser as claimed in any one of claims 4 to 6 wherein said substrate and subsequent material layers are single crystals of materials selected from the group comprising Gallium, Indium, Arsenic and Phosphorous combined in particular proportions in particular layers.

15. A current injection laser as claimed in any one of claims 4 to 6 wherein said substrate and subsequent material layers are single crystals of materials selected from the group comprising Gallium, Indium, Aluminium, Arsenic, and Antimony combined in particular proportions in particular layers.

16. A current injection laser as claimed in any one of claims 4 to 6 wherein said substrate and subsequent material layers are single crystals of materials selected from the group comprising Mercury, Cadmium, Manganese and Tellurium combined in particular proportions in particular layers.

17. A current injection laser as claimed in any one of claims 4 to 6 wherein said substrate subsequent material layers are single crystals of materials selected from the group comprising Lead, Sulphur, Tellurium and Selenium combined in particular proportions in particular layers.

18. A current injection laser as claimed in any one of claims 1 to 3 wherein said substrate and subsequent material layers are single crystals of materials selected from the group comprising Gallium, Aluminium, and Arsenic combined in particular proportions in particular layers, wherein said layers are in turn composed of finer layers being superlattice or multi-quantum-well structures.

19. A current injection laser as claimed in any one of claims 1 to 3 wherein said substrate and subsequent material layers are single crystals of materials selected from the group comprising Gallium, Indium, Arsenic and phosphorous combined in particular proportions in particular layers, wherein said layers are in turn composed of finer layers being superlattice or multi-quantum-well structures.

20. A current injection laser as claimed in any one of claims 1 to 3 wherein said substrate and subsequent material layers are single crystals of materials selected from the group comprising Gallium, Indium, Aluminium, Arsenic, and Antimony combined in particular proportions in particular layers, wherein said layers are in turn composed of finer layers being superlattice or multi-quantum-well structures.

21. A current injection laser as claimed in any one of claims 1 to 3 wherein said substrate and subsequent material layers are single crystals of materials selected from the group comprising Mercury, Cadmium, Manganese and Tellurium combined in particular proportions in particular layers, wherein said layers are in turn composed of finer layers being superlattice or multi-quantum-well structures.

22. A current injection laser as claimed in any one of claims 1 to 3 wherein said substrate and subsequent material layers are single crystals of materials selected from the group comprising Lead, Sulphur, Tellurium and Selenium combined in particular proportions in particular layers, wherein said layers are in turn composed of finer layers being superlattice or multi-quantum-well structures.

23. A current injection laser as claimed in any one of claims 1 to 3, wherein said layers are in turn composed of finer layers being superlattice or multi-quantum-well structures.

24. A current injection laser as claimed in any one of claims 4 to 6 wherein said layers are in turn composed of finer layers being superlattice or multi-quantum-well structures.

25. A current injection laser as claimed in any one of claims 1 to 3 wherein the wavelength of operation of the laser, $\lambda g$, is near the value of $\lambda p$, being a wavelength where occurs the peak in luminescent intensity for the resonator layer material, below the threshold, wherein said layers are in turn composed of finer layers being superlattice or multi-quantum-well structures.

26. A current injection laser as claimed in any one of claims 4 to 6 wherein the wavelength of operation of the laser, $\lambda g$, is near the value of $\lambda p$, being a wavelength where occurs the peak in luminescent intensity for the resonator layer material, below the threshold, wherein said layers are in turn composed of finer layers being superlattice or multi-quantum-well structures.

27. A current injection laser as claimed in any one of the claims 4 to 6 wherein said substrate and subsequent material layers are single crystals of materials selected from the group comprising Gallium, Aluminium and Arsenic combined in particular proportions in particular layers, wherein said layers are in turn composed of finer layers being superlattice or multi-quantum-well structures.

28. A current injection laser as claimed in any one of claims 4 to 6 wherein said substrate and subsequent material layers are single crystals of materials selected from the group comprising Gallium, Indium, Arsenic and phosphorous combined in particular proportions in particular layers, wherein said layers are in turn composed of finer layers being superlattice or multi-quantum-well structured.

29. A current injection laser as claimed in any one of claims 4 to 6 wherein said substrate and subsequent material layers are single crystals of materials selected from the group comprising Gallium, Indium, Aluminum, Arsenic and Antimony combined in particular proportions in particular layers, wherein said layers are in turn composed of finer layers being superlattice or multi-quantum-well structures.

30. A current injection laser as claimed in any one of claims 4 to 6 wherein said substrate and subsequent material layers are single crystals of materials selected from the group comprising mercury, Cadmium, Manganese and Tellurium combined in particular proportions in particular layers, wherein said layers are in turn composed of finer layers being superlattice or multi-quantum-well structures.

31. A current injection laser as claimed in any one of claims 4 to 6 wherein said substrate and subsequent material layers are single crystals of materials selected from the group comprising Lead, Sulphur, Tellurium and Selenium combined in particular proportions in particular layers, wherein said layers are in turn composed of finer layers being superlattice or multi-quantum-well structures.

32. A current injection laser as claimed in any one of claims 1 to 3 wherein said substrate and subsequent material layers are single crystals of materials selected from the group comprising Gallium, Aluminium and Arsenic combined in particular proportions in particular layers, wherein said layers are continuous graded in composition.

33. A current injection laser as claimed in any one of claims 1 to 3 wherein said substrate and subsequent material layers are single crystals of materials selected from the group comprising Gallium, Indium, Arsenic and phosphorous combined in particular proportions in particular layers, wherein said layers are continuous graded in composition.

34. A current injection laser as claimed in any one of claims 1 to 3 wherein said substrate and subsequent material layers are single crystals of materials selected from the group comprising Gallium, Indium, Aluminium, Arsenic and Antimony combined in particular proportions in particular layers, wherein said layers are continuous grated in composition.

35. A current injection laser as claimed in any one of claims 1 to 3 wherein said substrate and subsequent material layers are single crystals of materials selected from the group comprising Mercury, Cadmium, Manganese and Tellurium combined in particular proportions in particular layers, wherein said layers are continuous grated in composition.

36. A current injection laser as claimed in any one of claims 1 to 3 wherein said substrate and subsequent material layers are single crystals of materials selected from the group comprising Lead, Suphur, Tellurium and Selenium conbined in particular proportions in particular layers, wherein said layers are continuous graded in composition.

37. A current injection laser as claimed in any one of claims 1 to 3 wherein said layers are continuous graded in composition.

38. A current injection laser as claimed in any one of claims 4 to 6 wherein said layers are continuous graded in composition.

39. A current injection laser as claimed in any one of claims 1 to 3 wherein the wavelength of operation of the laser, $\lambda g$, is near the value of $\lambda p$, being a wavelength where occurs the peak in luminescent intensity for the resonator layer material, below the threshold, wherein said layers are continuous graded in composition.

40. A current injection laser is claimed in any one of claims 4 to 6 wherein the wavelength of operation of the laser, $\lambda g$, is near the value of $\lambda p$, being a wavelength where occurs the peak in luminescent intensity for the resonator layer material, below the threshold, wherein said layers aer continuous graded in composition.

41. A current injection laser as claimed in any one of claims 4 to 6 wherein said substrate and subsequent material layers are single crystals of materials selected from the group comprising Gallium, Aluminium and Arsenic combined in particular proportions in particular layers, wherein said layers are continuous graded in composition.

42. A current injection laser as claimed in any one of claims 4 to 6 wherein said substrate and subsequent material layers are single crystals of materials selected from the group comprising Gallium, Indium, Arsenic and Phosphorous combined in particular proportion in particular layers, wherein said layers are continuous graded in composition.

43. A current injection laser as claimed in any one of claims 4 to 6 wherein said substrate and subsequent material layers are single crystals of material selected from the group comprising Gallium, Indium, Aluminium, Arsenic and Antimony combined in particular proportion in particular layers, wherein said layers are continuous graded in composition.

44. A current injection laser as claimed in any one of claims 4 to 6 wherein said substrate and subsequent material layers are single crystals of material selected from the group comprising Mercury, Cadmium, Manganese and Tellurium combined in particular proportions in particular layers, wherein said layers are continuous graded in composition.

45. A current injection laser as claimed in any one of claims 4 to 6 wherein said substrate and subsequent material layers are single crystals of material selected from the group comprising Lead, Sulphur, Tellurium and Selenium combined in particular proportion in particular layers, wherein said layers are continuous graded in composition.

46. A current injection laser as claimed in any one of claims 1 to 3 wherein the wavelength of operation of the laser, $\lambda g$, is near the value of $\lambda p$, being a wavelength where occurs the peak in luminescent intensity for the resonator layer material, below the threshold, wherein said layers are in turn composed of finer layers being superlattice or multi-quantum-well structures.

47. A current injection laser as claimed in any one of claims 4 to 6 wherein the wavelength of operation of the laser, $\lambda g$, is near the value of $\lambda p$, being a wavelength where occurs the peak in luminescent intensity for the resonator layer material, below the threshold, where said layers are in turn composed of finer layers being superlattice or multi-quantum-well structures.

48. A current injection laser as claimed in any one of claims 1 to 3 wherein the wavelength of operation of the laser, $\lambda g$, is near the value of $\lambda p$, being a wavelength where occurs the peak in luminescent intensity for the resonator layer material, below the threshold, wherein said layers are continuous graded in composition.

49. A current injection laser as claimed in any one of claims 4 to 6 wherein the wavelength of operation of the laser, $\lambda g$, is near the value of $\lambda p$, being a wavelength where occurs the peak in luminescent intensity for the resonator layer material, below the threshold, wherein said layers are continuous graded in composition.

* * * * *

UNITED STATES PATENT AND TRADEMARK OFFICE
CERTIFICATE OF CORRECTION

PATENT NO. : 5,052,008
DATED : September 24, 1991
INVENTOR(S) : Peter C. Kemeny

It is certified that error appears in the above-indentified patent and that said Letters Patent is hereby corrected as shown below:

On the title page, Item

[30] Foreign Application Priority Data
Jan. 6, 1988 [AU] Australia    PI6189/88

Col. 4, line 11, "Current" should be --current--.

Col. 4, line 68, delete "," before "making".

Col. 6, line 51, delete ")" after $\lambda/2$".

Col. 10, line 45, "conbined" should be --combined--.

Col. 10, line 65, "aer" should be --are--.

Signed and Sealed this

Twelfth Day of April, 1994

Attest:

BRUCE LEHMAN

Attesting Officer

Commissioner of Patents and Trademarks